(12) United States Patent
Huang et al.

(10) Patent No.: US 11,380,719 B2
(45) Date of Patent: Jul. 5, 2022

(54) DISPLAY SUBSTRATE, METHOD FOR MANUFACTURING THE SAME, AND DISPLAY DEVICE

(71) Applicant: BOE Technology Group Co., Ltd., Beijing (CN)

(72) Inventors: Hua Huang, Beijing (CN); Changhan Hsieh, Beijing (CN); Muxin Di, Beijing (CN); Xiaoyan Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 179 days.

(21) Appl. No.: 16/667,382

(22) Filed: Oct. 29, 2019

(65) Prior Publication Data

US 2020/0135775 A1 Apr. 30, 2020

(30) Foreign Application Priority Data

Oct. 30, 2018 (CN) .......................... 201811280574.3

(51) Int. Cl.
| | |
|---|---|
| H01L 23/13 | (2006.01) |
| H01L 23/498 | (2006.01) |
| H01L 27/12 | (2006.01) |
| H01L 25/16 | (2006.01) |
| H01L 33/62 | (2010.01) |

(52) U.S. Cl.
CPC ........ *H01L 27/1266* (2013.01); *H01L 25/167* (2013.01); *H01L 27/124* (2013.01); *H01L 27/1218* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 9,693,455 B1 | 6/2017 | Park et al. | |
| 10,109,655 B2 | 10/2018 | Lee | |
| 2016/0300096 A1* | 10/2016 | Kim | ..................... G06K 9/0002 |
| 2016/0353568 A1 | 12/2016 | Lee et al. | |
| 2017/0301724 A1 | 10/2017 | Lee | |
| 2018/0006058 A1 | 1/2018 | Lee | |
| 2020/0066788 A1 | 2/2020 | Lee | |

FOREIGN PATENT DOCUMENTS

| | | |
|---|---|---|
| CN | 107302011 A | 10/2017 |
| CN | 107564928 A | 1/2018 |

OTHER PUBLICATIONS

First Office Action, including Search Report, for Chinese Patent Application No. 201811280574.3, dated Mar. 20, 2020, 13 pages.

* cited by examiner

*Primary Examiner* — Joseph C. Nicely
*Assistant Examiner* — Lamont B Koo
(74) *Attorney, Agent, or Firm* — Westman, Champlin & Koehler, P.A.

(57) ABSTRACT

Embodiments of the present disclosure provide a display substrate, a method for manufacturing a display substrate, and a display device. The method for manufacturing the display substrate includes: providing a seed layer on a first carrier substrate and forming a base substrate covering the seed layer; forming a first connection terminal on a side of the base substrate away from the first carrier substrate, the first connection terminal electrically connecting to the seed layer; removing the first carrier substrate to expose the seed layer; and forming a second connection terminal electrically connecting to the seed layer.

9 Claims, 4 Drawing Sheets

SaveUS 11,380,719 B2

DISPLAY SUBSTRATE, METHOD FOR MANUFACTURING THE SAME, AND DISPLAY DEVICE

CROSS-REFERENCE TO RELATED APPLICATION

This application claims priority of Chinese Patent Application No. 201811280574.3 filed on Oct. 30, 2018 in China National Intellectual Property Administration, the disclosure of which is incorporated herein by reference in entirety.

TECHNICAL FIELD

Embodiments of the present disclosure relate to the field of display technology, and in particular, to a display substrate, a method for manufacturing a display substrate, and a display device.

BACKGROUND

With the development of display technology, the types of display devices and display substrates have become increasingly diverse. In addition to liquid crystal display devices, some of the display substrates are constructed in such a way that a light emitting element is provided on one side (for example, an upper side) of a base substrate, and a port electrically connected to the light emitting element is provided on the opposite side (for example, a lower side) of the base substrate, and then the light emitting element is controlled to illuminate by an external control circuit, to achieve the display. Taking a display substrate based on a light emitting diode (LED) as an example, generally, a connection port (IC PAD) connected to an external control circuit (control IC) and a connection port (LED PAD) configured to be electrically connected to a light emitting diode device are respectively provided on the upper and lower sides of the base substrate, the two ports are connected together through a via hole penetrating through the base substrate, thereby realizing the communication between the external control circuit and the light emitting diode device.

However, the current display substrate, its manufacturing method, and the display device still need to be improved.

SUMMARY

In an aspect of the present disclosure, there is provided in some embodiments of the present disclosure a method for manufacturing a display substrate, comprising:

providing a seed layer on a first carrier substrate and forming a base substrate covering the seed layer;

forming a first connection terminal on a side of the base substrate away from the first carrier substrate, the first connection terminal electrically connecting to the seed layer;

removing the first carrier substrate to expose the seed layer; and forming a second connection terminal electrically connecting to the seed layer.

According to some embodiments of the present disclosure, before forming the first connection terminal, the method further comprises:

forming at least one via hole, the at least one via hole at least extending through the base substrate; and forming at least one injected electrically-conductive layer in the at least one via hole, wherein the first connection terminal is electrically connected to the seed layer through the at least one injected electrically-conductive layer.

According to some embodiments of the present disclosure, the at least one via hole comprises a first via hole and a second via hole, the at least one injected electrically-conductive layer comprises a first injected electrically-conductive layer and a second injected electrically-conductive layer, and the method comprises:

forming the first via hole that extends through the base substrate to expose the seed layer, and forming the first injected electrically-conductive layer in the first via hole;

forming a thin film transistor on the side of the base substrate away from the first carrier substrate, an electrode of the thin film transistor being connected to the first injected electrically-conductive layer; and forming the second via hole to expose the first injected electrically-conductive layer, and forming the second injected electrically-conductive layer that is connected to the first injected electrically-conductive layer in the second via hole, wherein the first connection terminal is electrically connected to the seed layer through the first injected electrically-conductive layer and the second injected electrically-conductive layer.

According to some embodiments of the present disclosure, a material for forming the seed layer comprises at least one of Al, Mo, or Cu, a material for forming the first injected electrically-conductive layer comprises Cu, and a material for forming the second injected electrically-conductive layer comprises Cu.

According to some embodiments of the present disclosure, before removing the first carrier substrate, the method further comprises: providing a second carrier substrate on a side of the first connection terminal away from the first carrier substrate.

According to some embodiments of the present disclosure, a sacrificial layer is formed between the seed layer and the first carrier substrate, and the removing the first carrier substrate is done by removing the sacrificial layer.

According to some embodiments of the present disclosure, a sacrificial layer is formed between the first connection terminal and the second carrier substrate, and removing the second carrier substrate is done by removing the sacrificial layer.

According to some embodiments of the present disclosure, a material for forming the base substrate comprises PI and the at least one via hole is formed by laser etching.

According to some embodiments of the present disclosure, the method further comprises: providing a light emitting diode on a side of the base substrate on which the second connection terminal is provided, an electrode of the light emitting diode being connected to the second connection terminal.

In another aspect of the present disclosure, there is provided in some embodiments of the present disclosure a display substrate, manufactured by the method according to any one of the above embodiments.

In still another aspect of the present disclosure, there is provided in some embodiments of the present disclosure a display substrate, comprising:

a base substrate;

a first connection terminal and a second connection terminal provided on two opposite sides of the base substrate, respectively; and a seed layer, wherein the seed layer is provided on the base substrate, and the first connection terminal is connected to the second connection terminal through the seed layer.

According to some embodiments of the present disclosure, the display substrate further comprises at least one injected electrically-conductive layer, wherein the first connection terminal is connected to the second connection terminal through the at least one injected electrically-conductive layer and the seed layer.

According to some embodiments of the present disclosure, a backplane circuit layer is provided between the base substrate and the first connection terminal, the at least one injected electrically-conductive layer comprises a first injected electrically-conductive layer and a second injected electrically-conductive layer, the first injected electrically-conductive layer is disposed in the base substrate, the second injected electrically-conductive layer is disposed in the backplane circuit layer, and the first connection terminal is connected to the second connection terminal through the first injected electrically-conductive layer, the second injected electrically-conductive layer, and the seed layer.

According to some embodiments of the present disclosure, the first injected electrically-conductive layer has a height greater than 5 microns and the second injected electrically-conductive layer has a height greater than 2 microns.

According to some embodiments of the present disclosure, a material for forming the seed layer comprises at least one of Al, Mo, or Cu, a material for forming the first injected electrically-conductive layer comprises Cu, and a material for forming the second injected electrically-conductive layer comprises Cu.

According to some embodiments of the present disclosure, the backplane circuit layer comprises a thin film transistor, and at least one of the first injected electrically-conductive layer and the seed layer is connected to a gate electrode of the thin film transistor.

According to some embodiments of the present disclosure, a light emitting diode is provided on a side of the base substrate on which the second connection terminal is provided, an electrode of the light emitting diode is connected to the second connection terminal.

In still another aspect of the present disclosure, there is provided in some embodiments of the present disclosure a display device, comprising the display substrate manufactured by the method according to any one of the above embodiments.

In still another aspect of the present disclosure, there is provided in some embodiments of the present disclosure a display device, comprising the display substrate according to any one of the above embodiments.

BRIEF DESCRIPTION OF THE DRAWINGS

The above and/or additional aspects and advantages of the present disclosure will become apparent and readily understood from the description of the embodiments with reference to the accompanying drawings below. In the drawings.

DETAILED DESCRIPTION OF EMBODIMENTS

Figure 1:
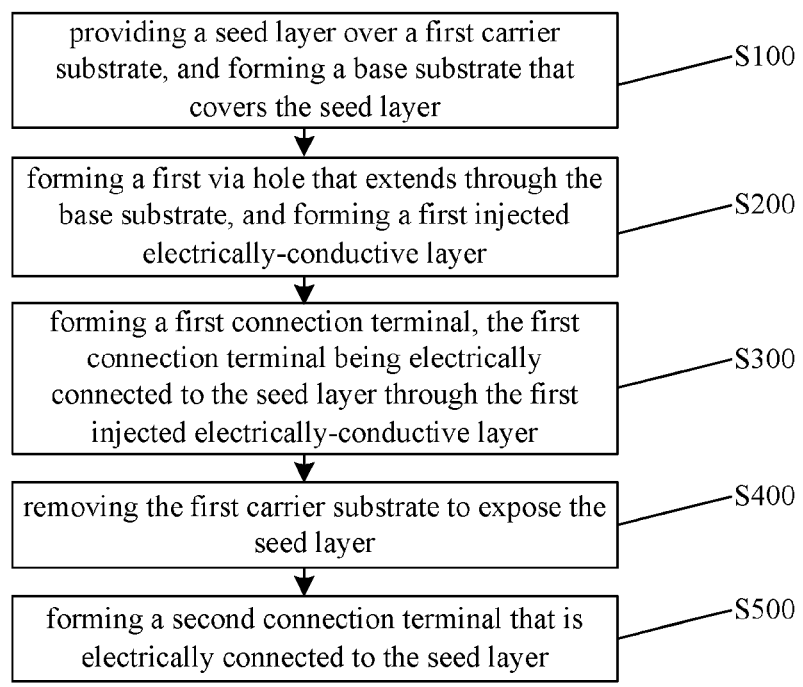
FIG. 1 is a schematic flow chart of a method for manufacturing a display substrate according to an embodiment of the present disclosure.

The embodiments of the present disclosure will be described in detail below. The examples of the embodiments are illustrated in the drawings, and the same or similar reference numerals represent the same or similar elements or elements that include the same or similar functions throughout the specification. The embodiments described below with reference to the accompanying drawings are intended to be illustrative only for explaining the present disclosure, and but not to be construed as limiting the present disclosure.

The embodiments of the present disclosure are based on the discovery and recognition of the following facts and problems by the designer: the manufacturing process of the display substrate based on the light emitting element is complicated, and the designer finds that the reason is mainly that the realization of the communication between the external control circuit port (IC PAD) and the light emitting element port (LED PAD) usually requires forming a through hole extending through the entire base substrate by etching, and then injecting metal into the through hole, to realize the communication between the two ports. However, the base substrate itself, particularly a flexible base substrate, has a certain thickness, and the backplane circuit including the thin film transistor or the like needs to be disposed on the flexible base substrate, therefore the depth of the through hole extending through the entire flexible base substrate is relatively large, which thereby makes it difficult to inject metal into the deep hole.

Embodiments of the present disclosure are intended to at least alleviate or address one of the above mentioned problems to some extent.

In one aspect of the present disclosure, an embodiment of the present disclosure proposes a method for manufacturing a display substrate. By means of providing a seed layer and implementing the operation of injecting metal twice, the method can avoid complicated processing steps such as filling metal into a deep hole and realize the connection between the LED PAD and the IC PAD. That is, the method can avoid forming a through hole that extends through the entire substrate at one time, and thereby avoid the problem of complicated process due to difficulty in filling the metal in the deep hole subsequently.

Figure 2:
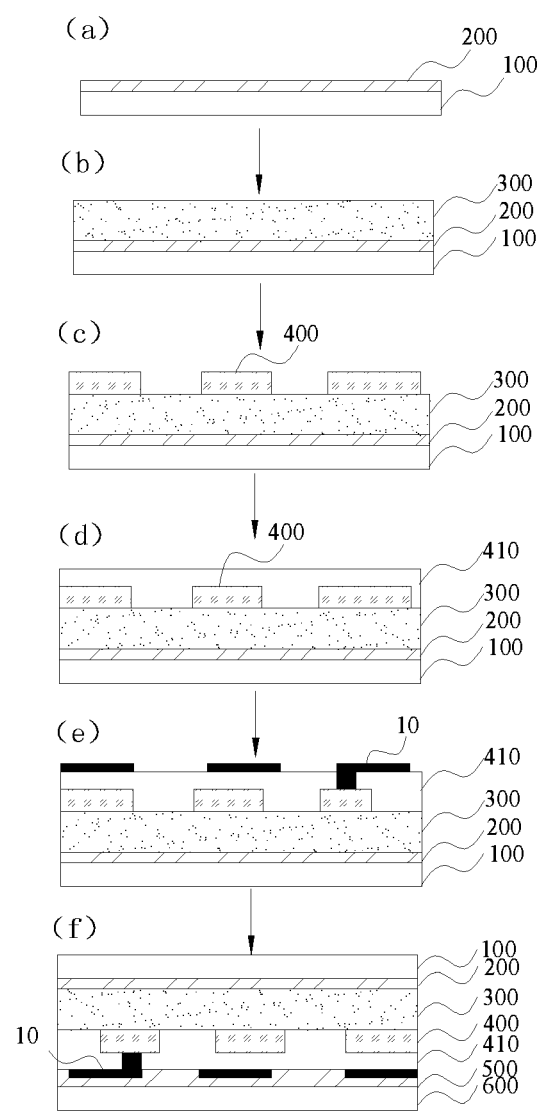
FIG. 2 is a schematic view showing partial processes of a method for manufacturing a display substrate in the related art.
Figure 3:
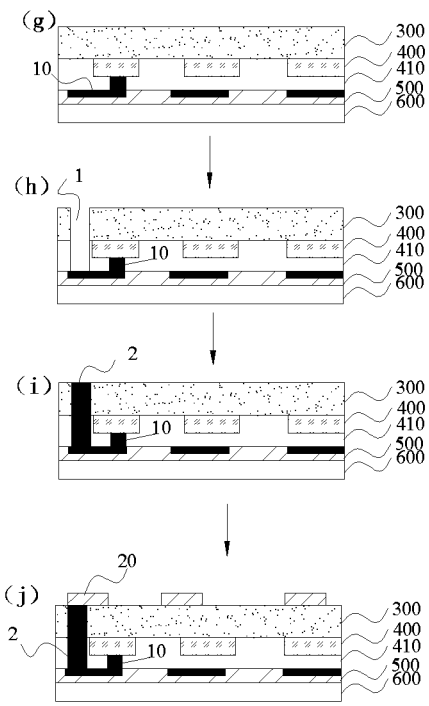
FIG. 3 is a schematic view showing partial processes of a method for manufacturing a display substrate in the related art.

For the convenience of understanding, the manufacturing process based on the filling of metal into a deep hole in the related art will be first briefly described below. Referring to FIG. 2, when a display substrate is manufactured, especially when connection ports need to be respectively provided on the upper and lower sides of the base substrate, the connection ports on two sides of the base substrate need to be communicated with each other, and therefore it is necessary to form a deep hole extending through the base substrate and the structure on the base substrate. Taking a flexible substrate based on a light emitting diode as an example, in the manufacturing process in the related art, a flexible base substrate is generally formed on a carrier substrate, and the required structure for a light emitting diode substrate is integrated on the flexible base substrate, and then the carrier substrate is removed. Specifically, referring to (a) and (b) of FIG. 2, a sacrificial layer 200 is first formed on a first carrier substrate 100 (which may be a glass substrate), and then a base substrate 300 (which may be flexible) is formed on a side of the sacrificial layer 200 away from the first carrier substrate 100. When the first carrier substrate 100 needs to be removed later, the base substrate 300 can be separated from the first carrier substrate 100 by removing the sacrificial layer 200. Subsequently, a process for manufacturing a backplane circuit is performed on the base substrate 300, as shown in (c) and (d) of FIG. 2, for example, forming a semiconductor structure 400 (for example, structures for forming a gate electrode, an active layer, etc. of a thin film transistor), and forming a functional layer 410 (for example, an insulating layer, a passivation layer, a planarization layer, source/drain electrodes, etc.) covering the semiconductor structure 400, to constitute a backplane circuit including a switching device (for example, a thin film transistor), to achieve the control of each light emitting diode. Subsequently, a first connection terminal 10 is formed, the first connection terminal 10 is connected to the semiconductor structure 400 (for example, connected to the gate electrode) through a via hole extending through the functional layer 410. Subsequently, a second sacrificial layer 500 and a second carrier substrate 600 are formed on the exposed side of the first connection terminal 10, and then the sacrificial layer 200 is removed to achieve the peeling of the first carrier substrate 100 and expose the side of the base substrate 300 where no semiconductor structure 400 is provided (referring to (g) of FIG. 3). A light emitting diode is provided on a side of the flexible base substrate 300 exposed to the outside in (g) of FIG. 3. At this time, in order to realize electrical connection between the subsequent light emitting diode and the first connection terminal 10 (IC PAD), referring to (h) of FIG. 3, it is necessary to form a deep hole 1 that extends through the structure of the flexible substrate 300 and the like. Subsequently, referring to (i) to (j) of FIG. 3, a metal 2 is injected into the deep hole 1, and a second connection terminal 20 connected to the metal 2 is formed. The second connection terminal 20 may be an LED PAD for subsequent connection of the light emitting diode device. Thereby, an electrical connection between the first connection terminal 10 (IC PAD) and the second connection terminal 20 (LED PAD) can be achieved. The depth of the deep hole 1 is at least a sum of the thickness of the flexible base substrate (typically greater than 5 microns) and the thicknesses of the functional layer 410 and the semiconductor structure 400 (the sum of the thicknesses of the inorganic layer, the active layer and the like is typically greater than 2 microns). It is difficult to achieve the deep hole of this depth by dry etching, and it is relatively difficult to perform metal injection into the formed deep hole 1.

Figure 4:
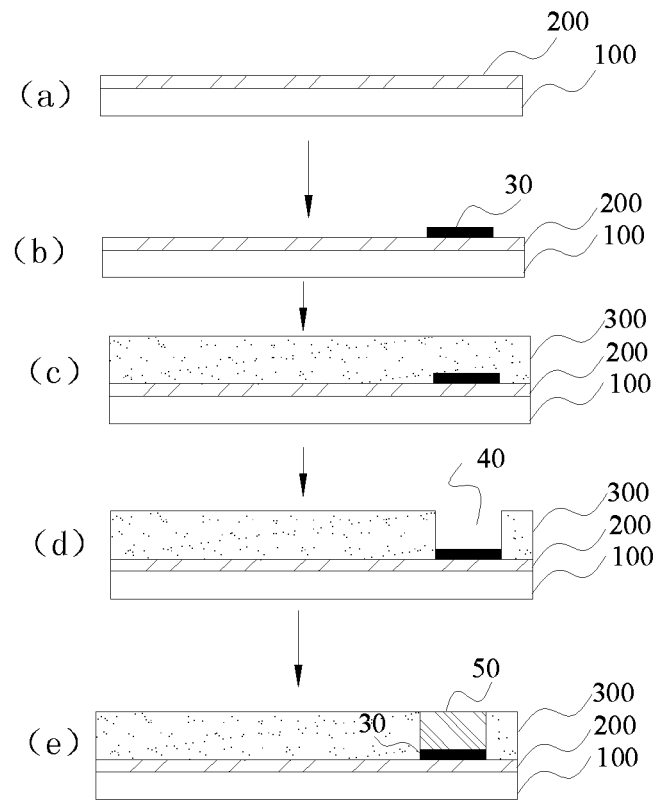
FIG. 4 is a schematic view showing partial processes of a method for manufacturing a display substrate according to an embodiment of the present disclosure.

According to an embodiment of the present disclosure, referring to FIG. 1 and FIG. 4, the method includes:

S100: providing a seed layer over a first carrier substrate, and forming a base substrate that covers the seed layer.

According to some embodiments of the present disclosure, in this step, a seed layer is first provided over a first carrier substrate, and a base substrate that covers the seed layer is formed.

According to some embodiments of the present disclosure, referring to (a) and (b) of FIG. 4, a sacrificial layer 200 may be further formed between the seed layer 30 and the first carrier substrate 100. The specific material of the sacrificial layer 200 is not particularly limited, and it may be formed of a material commonly used for manufacturing a base substrate in the prior art, for example, the sacrificial layer 200 may be formed of a material that can be removed by gasification. Thus, in the subsequent steps, the first carrier substrate 100 can be easily removed by gasifying the sacrificial layer 200. The material for forming the seed layer 30 may include at least one of Al, Mo, or Cu. The seed layer is mainly used for subsequent electrical connection between two connection terminals (IC PAD and LED PAD described above) disposed respectively on two sides of the base substrate, and the above materials have relatively good electrical properties. The seed layer 30 formed of the above materials does not impair the performance of the entire base substrate due to its own resistance.

Referring to (c) of FIG. 4, subsequently, the base substrate 300 is formed on the side where the seed layer 30 is provided. The material for forming the base substrate 300 may include PI (polyimide). The base substrate 300 may have a conventional thickness, for example, greater than 5 microns. In addition, since the method according to embodiments of the present disclosure does not involve forming a deep hole that extends through both the base substrate 300 and the backplane circuit structure, the thickness of the base substrate 300 herein may not be limited by the subsequent etching process and metal injection process.

S200: forming a first via hole that extends through the base substrate, and forming a first injected electrically-conductive layer.

According to some embodiments of the present disclosure, in this step, referring to (d) and (e) of FIG. 4, a first via hole 40 that extends through the base substrate 300 is formed at a position corresponding to the seed layer 30, and a first injected electrically-conductive layer 50 is formed in the first via hole 40. Specifically, the first via hole 40 may be formed by laser etching, thereby the first via hole 40 extending through the base substrate may be easily formed. Since the depth of the first via hole 40 is only the thickness of the base substrate 300 (for example, slightly greater than 5 microns), it can be easily realized by a laser etching process. Further, the process of performing metal injection into the first via hole 40 of this depth is also relatively easily realized.

According to some embodiments of the present disclosure, the specific material for forming the first injected electrically-conductive layer 50 is not particularly limited, for example, the first injected electrically-conductive layer 50 may be formed of a metal including, but not limited to, copper or the like. Thereby, it is advantageous to reduce contact resistance between it and the seed layer formed previously.

S300: forming a first connection terminal, the first connection terminal being electrically connected to the seed layer through the first injected electrically-conductive layer.

According to some embodiments of the present disclosure, in this step, a first connection terminal is formed over the base substrate, and the first connection terminal is electrically connected to the seed layer through the first injected electrically-conductive layer. According to some embodiments of the present disclosure, the first connection terminal may be a connection terminal for subsequent connection with an external control chip or circuit (IC), i.e., the IC PAD described above.

Figure 5:
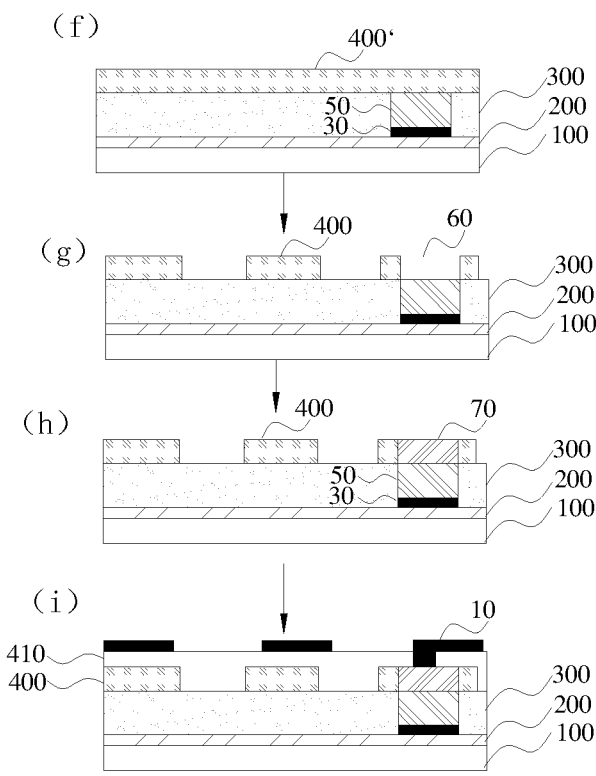
FIG. 5 is a schematic view showing partial processes of a method for manufacturing a display substrate according to an embodiment of the present disclosure.

According to a specific embodiment of the present disclosure, referring to (f) to (i) of FIG. 5, this step may further include the following sub-steps: forming a thin film transistor on a side of the base substrate 300 away from the first carrier substrate 100.

Thus, each of the light emitting diodes subsequently formed on the base substrate may be controlled by the thin film transistor. An electrode of the thin film transistor is connected to the first injected electrically-conductive layer. Specifically, a gate electrode of the thin film transistor may be connected to the first injected electrically-conductive layer 50. The thin film transistor and the first connection terminal may be specifically formed as follows.

Firstly, a gate electrode and an active layer 400' are formed on the base substrate 300, and then a semiconductor structure 400 (which may include a gate and a patterned channel region, etc.) is formed by a patterning process. Subsequently, a second via hole 60 is formed to expose the first injected electrically-conductive layer by a patterning process, and a second injected electrically-conductive layer 70 that is connected to the first injected electrically-conductive layer is formed in the second via hole. Thereby, the second injected electrically-conductive layer 70 may be electrically connected to the gate electrode. Subsequently, the manufacturing processes of other functional layers of the backplane circuit may be proceeded to form the functional layer 410. The functional layer 410 may also include structures such as an insulating layer, a passivation layer, a planarization layer, source/drain electrodes, and the like, and may also include structures such as metal traces. In this step, except for the operation of forming the second via hole 60 and the second injected electrically-conductive layer 70, the other operations may be the same as those in the method for manufacturing a flexible light emitting diode substrate in the related art, and they may be designed by those skilled in the art according to actual needs, and therefore they will not be repeated herein. Subsequently, the first connection terminal 10 is formed on a side of the functional layer 410 away from the base substrate 300. The first connection terminal 10 may be connected to the second injected electrically-conductive layer 70 through a via hole, and further connected to the first injected electrically-conductive layer and the seed layer.

The material for forming the seed layer may include at least one of Al, Mo, or Cu, and the materials for forming the first injected electrically-conductive layer and the second injected electrically-conductive layer may independently include Cu. Thereby, it is possible to ensure a small contact resistance between the layers of metal, thereby ensuring that the performance of the entire display substrate is not adversely affected by the introduction of the multiple layers of metal.

It should be particularly noted here that, although the method according to the embodiments of the present disclosure has operations of forming the second via hole, the second injected electrically-conductive layer and the like, the operation steps of the overall process are not significantly increased. The reason is that: when manufacturing the base substrate, the backplane circuit structure needs to be formed, and the process for manufacturing the backplane circuit structure itself involves multiple patterning processes and via hole etching processes. Therefore, the manufacture of the second via hole and the second injected electrically-conductive layer may be performed simultaneously with the above multiple patterning processes and the material deposition processes. Therefore, according to the method provided by the embodiments of the present disclosure, it can avoid etching a deep hole without significantly increasing the number of process steps.

S400: removing the first carrier substrate to expose the seed layer.

According to some embodiments of the present disclosure, in this step, the first carrier substrate is removed and the seed layer on one side of the first carrier substrate is exposed. Referring to (j) and (k) of FIG. 6, the side of the seed layer 30 where the first injected electrically-conductive layer 50 is not provided may be easily exposed in this step. In this step, the removal of the first carrier substrate 100 may be done by gasifying the sacrificial layer 200.

According to some embodiments of the present disclosure, since the subsequent process needs to expose a surface of the seed layer away from the backplane circuit structure (the semiconductor structure 400, or the like), it is necessary to remove the first carrier substrate 100. However, since the subsequent process still needs to be implemented on a rigid support structure, a second sacrificial layer 500 and a second carrier substrate 600 may be formed in advance on a side of the first connection terminal 10 away from the first carrier substrate 100, before the first carrier substrate 100 is removed. The material for forming the second sacrificial layer 500 and the second carrier substrate 600 may be the same as that for forming the sacrificial layer 200 and the first carrier substrate 100.

S500: forming a second connection terminal that is electrically connected to the seed layer.

Figure 6:
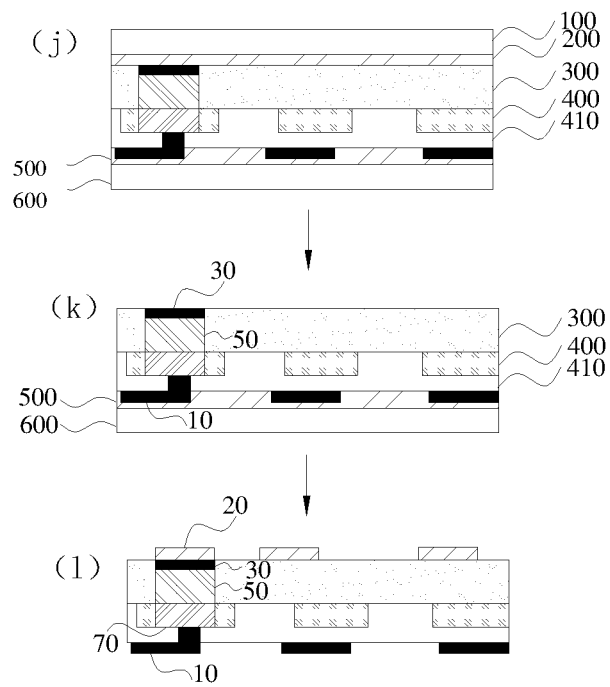
FIG. 6 is a schematic view showing partial processes of a method for manufacturing a display substrate according to an embodiment of the present disclosure.

According to some embodiments of the present disclosure, referring to (1) of FIG. 6, in this step, a second connection terminal 20 that is connected to the seed layer 30 is formed. Thereby, the electrical connection between the first connection terminal 10 and the second connection terminal 20 can be achieved without etching a via hole having an excessive depth. Subsequently, an operation of removing the second sacrificial layer 500 and the second carrier substrate 600 may also be performed, thereby obtaining the display substrate according to the embodiments of the present disclosure.

Through the above method, it is possible to avoid forming a through hole that extends through the entire substrate at one time, and thereby avoid the problem of complicated process due to difficulty in filling the metal in the deep hole subsequently.

According to some embodiments of the present disclosure, the method may further include an operation of providing a light emitting element on a side of the base substrate 300 on which the second connection terminal 20 is provided. An electrode of the light emitting element, for example, but not limited to, a light emitting diode, is connected to the second connection terminal 20. Thereby, when the first connection terminal 10 is connected to the external circuit, a control signal of the external circuit may be input through the first connection terminal 10, and through a device such as a thin film transistor in the backplane circuit structure and through the second connection terminal 20, into each of the light emitting elements on the substrate, thereby the light emitting condition of each of the light emitting elements can be controlled.

In another aspect of the present disclosure, an embodiment of the present disclosure proposes a display substrate. The display substrate is manufactured by the method described above. Thereby, the manufacturing process of the display substrate is relatively simple, and therefore it has at least an advantage such as low production cost, or the like. The display substrate may be a flexible light emitting diode substrate.

The display substrate may include: a base substrate 300, and a first connection terminal and a second connection terminal respectively disposed on two opposite sides of the base substrate 300. A backplane circuit layer is provided between the base substrate and the first connection terminal, wherein a first via hole is provided in the base substrate and a second via hole is provided in the backplane circuit layer, and the first connection terminal and the second connection terminal are connected through the first via hole and the second via hole. The connection between the first connection terminal and the second connection terminal in the display device is achieved not by a through hole with a large depth, therefore the display substrate can be manufactured by a relatively simple production process and it can avoid the product yield problem caused by the filling of metal into the deep hole. The structure of the display substrate may be as shown in (1) of FIG. 6. The display substrate may be a flexible light emitting diode substrate.

According to some embodiments of the present disclosure, the first via hole is filled with a first injected electrically-conductive layer, and the second via hole is filled with a second injected electrically-conductive layer. A seed layer is interposed between the first injected electrically-conductive layer and the first connection terminal. Thereby, it can avoid the product yield problem caused by the filling of metal into the deep hole. The materials of the seed layer, the first injected electrically-conductive layer and the second injected electrically-conductive layer may be the same as those of the corresponding structures (the seed layer, the first injected electrically-conductive layer and the second injected electrically-conductive layer) in the method described above, and therefore the details will not be described herein again.

According to some embodiments of the present disclosure, the depth of the first via hole is greater than 5 microns and the depth of the second via hole is greater than 2 microns. It can be seen that, if the structure according to the embodiments of the present disclosure is not employed, and the connection between the first connection terminal and the second connection terminal is realized by one through hole, then the depth of the through hole will exceed 7 microns. For a deep hole of 7 microns or more, it is not only difficult to form it by dry etching, but also causes a significant increase in process difficulty in the subsequent metal injection process. Thereby, the structure of the flexible light emitting diode substrate according to the embodiments of the present disclosure has at least an advantage that the difficulty of the manufacturing process can be reduced.

According to some embodiments of the present disclosure, a side of the base substrate where the second connection terminal is disposed may be further provided with a light emitting diode, and an electrode of the light emitting diode is connected to the second connection terminal. According to some embodiments of the present disclosure, the backplane circuit layer includes a thin film transistor, and at least one of the first injected electrically-conductive layer and the seed layer is connected to a gate electrode of the thin film transistor. Thereby, when the first connection terminal is connected to the external circuit, a control signal of the external circuit may be input through the first connection terminal, and through a device such as a thin film transistor in the backplane circuit structure and through the second connection terminal, into each of the light emitting elements on the substrate, thereby the light emitting condition of each of the light emitting elements can be controlled.

In yet another aspect of the present disclosure, an embodiment of the present disclosure provides a display device. According to some embodiments of the present disclosure, the display device includes a display substrate manufactured by the method described above. The display device includes a flexible light emitting diode substrate manufactured by the method described above or a micro light emitting diode substrate.

In the description of the embodiments of the present disclosure, orientational or positional relationships indicated by the terms "upper", "lower" and the like are based on the orientational or positional relationships shown in the drawings. The orientational or positional relationships in the drawings are only for the convenience of describing the present disclosure, but should not be interpreted that the present disclosure must be constructed or operated in a specific orientation, and therefore should not be construed as limiting the present disclosure.

In the description of this specification, the description with reference to the terms "an embodiment", "another embodiment" or the like means that the specific features, structures, materials or characteristics described in connection with the embodiment are included in at least one embodiment of the present disclosure. In this specification, the schematic representation of the above terms is not necessarily directed to the same embodiment or example. Furthermore, the specific features, structures, materials, or characteristics described may be combined in any one or more embodiments or examples in a suitable manner. Moreover, in the case where no mutual contradiction occurs, various embodiments or examples or features in various embodiments or examples described in the specification may be incorporated and combined by those skilled in the art. In addition, it should be noted that, in this specification, the terms "first" and "second" are only used for descriptive purposes, but should not be construed as indicating or implying a relative importance or implicitly indicating the number of the involved technical features.

While the embodiments of the present disclosure have been shown and described above, it is to be understood that the above embodiments are illustrative and are not to be construed as limiting the scope of the present disclosure. Changes, modifications, substitutions and variations may be made to the above embodiments by those skilled in the art within the scope of the present disclosure.

What is claimed is:

1. A method for manufacturing a display substrate, comprising:
    providing a seed layer on a first carrier substrate and forming a base substrate covering the seed layer;
    forming a first connection terminal on a side of the base substrate away from the first carrier substrate, the first connection terminal electrically connecting to the seed layer;
    removing the first carrier substrate to expose the seed layer; and
    forming a second connection terminal electrically connecting to the seed layer;
    wherein, before forming the first connection terminal, the method further comprises:
    forming at least one via hole, the at least one via hole at least extending through the base substrate; and
    forming at least one injected electrically-conductive layer in the at least one via hole,
    wherein the first connection terminal is electrically connected to the seed layer through the at least one injected electrically-conductive layer;
    wherein the at least one via hole comprises a first via hole and a second via hole, the at least one injected electrically-conductive layer comprises a first injected electrically-conductive layer and a second injected electrically-conductive layer, and the method comprises:

forming the first via hole that extends through the base substrate to expose the seed layer, and forming the first injected electrically-conductive layer in the first via hole;

forming a thin film transistor on the side of the base substrate away from the first carrier substrate, an electrode of the thin film transistor being connected to the first injected electrically-conductive layer; and forming the second via hole to expose the first injected electrically-conductive layer, and forming the second injected electrically-conductive layer that is connected to the first injected electrically-conductive layer in the second via hole, wherein the first connection terminal is electrically connected to the seed layer through the first injected electrically-conductive layer and the second injected electrically-conductive layer.

2. The method according to claim 1, wherein a material for forming the seed layer comprises at least one of Al, Mo, or Cu, a material for forming the first injected electrically-conductive layer comprises Cu, and a material for forming the second injected electrically-conductive layer comprises Cu.

3. The method according to claim 1, wherein, before removing the first carrier substrate, the method further comprises: providing a second carrier substrate on a side of the first connection terminal away from the first carrier substrate.

4. The method according to claim 1, wherein a sacrificial layer is formed between the seed layer and the first carrier substrate, and the removing the first carrier substrate is done by removing the sacrificial layer.

5. The method according to claim 3, wherein a sacrificial layer is formed between the first connection terminal and the second carrier substrate, and removing the second carrier substrate is done by removing the sacrificial layer.

6. The method according to claim 1, wherein a material for forming the base substrate comprises PI and the at least one via hole is formed by laser etching.

7. The method according to claim 1, further comprising:
providing a light emitting diode on a side of the base substrate on which the second connection terminal is provided, an electrode of the light emitting diode being connected to the second connection terminal.

8. A display substrate, manufactured by the method according to claim 1.

9. A display device, comprising the display substrate manufactured by the method according to claim 1.

* * * * *